United States Patent [19]

Sawaya et al.

[11] Patent Number: 5,314,842
[45] Date of Patent: May 24, 1994

[54] RESIN-SEALED TYPE SEMICONDUCTOR DEVICE AND METHOD FOR MANUFACTURING THE SAME

[75] Inventors: Hiromichi Sawaya; Toshio Ishigami, both of Kawasaki, Japan

[73] Assignee: Kabushiki Kaisha Toshiba, Kawasaki, Japan

[21] Appl. No.: 944,366

[22] Filed: Sep. 14, 1992

Related U.S. Application Data

[62] Division of Ser. No. 406,065, Sep. 12, 1989, abandoned.

[30] Foreign Application Priority Data

Sep. 30, 1988 [JP] Japan .................. 63-247191

[51] Int. Cl.⁵ ........................................ H01L 21/60
[52] U.S. Cl. ...................................... 437/211; 437/209; 437/214; 437/215; 437/220
[58] Field of Search ............... 437/211, 209, 214, 220, 437/215, 217, 218, 219

[56] References Cited

U.S. PATENT DOCUMENTS 4,483,067 11/1984 Parmentier .
4,866,506 9/1989 Nambu et al. .

FOREIGN PATENT DOCUMENTS 59-191337 10/1984 Japan .
60-171746 9/1985 Japan .
60-208847 10/1985 Japan .
61-253840 11/1986 Japan .
62-185348 8/1987 Japan .
63-232452 5/1988 Japan .
63-131559 6/1988 Japan .
63-211744 9/1988 Japan .

*Primary Examiner*—Brain E. Hearn
*Assistant Examiner*—Kevin M. Picardat
*Attorney, Agent, or Firm*—Finnegan, Henderson, Farabow, Garrett & Dunner

[57] ABSTRACT

A resin-sealed type semiconductor device comprises a lead frame having a bed and external leads, a semiconductor element mounted on the bed and having electrodes, a fine metal wire for making an electrical connection between the electrode and the lead frame, a resin layer which seals the semiconductor element, fine metal wire and portion of the lead frame therein and a recess formed at a central portion of one surface side of the resin layer and having a controlled depth, whereby the development of cracks in the resin layer as caused by heat load is prevented.

4 Claims, 2 Drawing Sheets

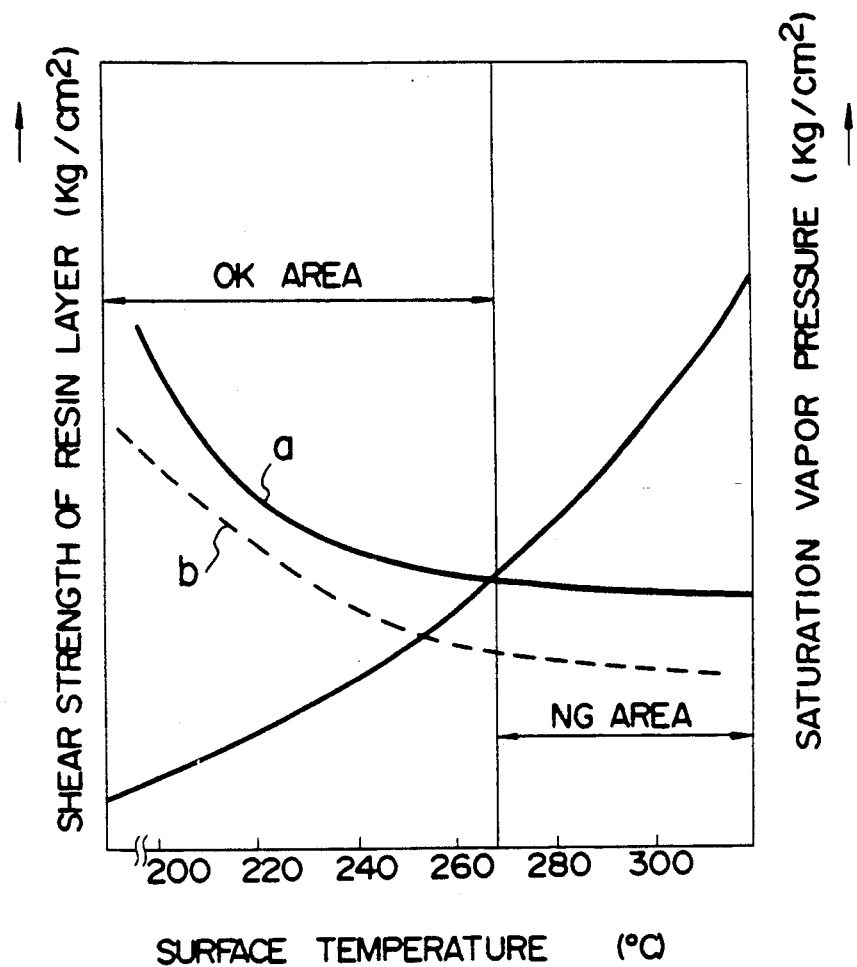
F I G. 3

RESIN-SEALED TYPE SEMICONDUCTOR DEVICE AND METHOD FOR MANUFACTURING THE SAME

This application is a division of application Ser. No. 07/406,065, filed Sep. 12, 1989, now abandoned.

BACKGROUND OF THE INVENTION

1. Field of the Invention

The present invention relates to a surface-mount type semiconductor device and, in particular, to a semiconductor device in which, for example, a semiconductor element mounted on a lead frame is sealed with a resin.

2. Description of the Related Art

A resin-sealed type semiconductor device comprises a semiconductor element mounted on a bed of a lead frame, fine metal wires electrically connecting electrodes of the semiconductor element to external leads of the lead frame, a resin layer fixedly sealing the semiconductor element, a portion of the lead frame and the fine metal wires, and a recess formed in the resin layer at a resin-sealing step. The resin sealing step is carried out by locating an assembly of the semiconductor element, a portion of the lead frame and the fine metal wires in the cavity of a mold, introducing a sealing resin which is melted in a pot into the mold cavity, subjecting the resin thus introduced to an aging process, and after completing such a series of steps, knocking a resin-sealed semiconductor element out of the mold by an ejector pin which is located at a lower mold half thereof. Since, at this knock-out step, the sealing resin is not yet solidified, a recess is formed at that place of the sealed resin layer where the resin-sealed semiconductor element is knocked out by the ejector pin. The ejector pin is somewhat projected out of the lower mold half of the mold. In the prior art, there is no proposed concept that the dimension of the ejector pin be controlled. Therefore, the depth of the recess thus obtained in the resin-sealing step varies over a range of 80 to 150 μm.

The semiconductor device, after being temporarily fixed to the mount substrate, has its external lead soldered to the mount substrate. In the conventional sealed resin layer, cracks are developed due to thermal stress upon assembly of the aforementioned components by soldering, so that a decided imperfection occurs due to such cracks. This imperfection involves the following defects:

(1) After the device is mounted as set forth above, the sealed resin layer absorbs moisture through the cracks under a practical atmosphere, causing the semiconductor substrate or associated components to be corroded due to the moisture intruded.

(2) After the device is mounted as set forth above, cracks occur near the recess by thermal load caused at the soldering step and become more wide open there, bringing a "temporary state of fixing" into an unstable state. In an extreme case, the semiconductor element is removed from the bed.

In the surface-mount type semiconductor device, the resin layer is maintained to at least about 1.0 mm. There is, however, a growing demand that a compact semiconductor element be applied at a high integration density to the semiconductor device. A package with a semiconductor element sealed with a resin requires more exact external lead pitch and is made as near a bare chip as possible. However, no adequate preparation has been made so as to solve the aforementioned problems.

SUMMARY OF THE INVENTION

It is accordingly the object of the present invention to provide a resin-sealed type semiconductor device which, even if a sealed resin layer is made thinner, prevents the development of cracks in the sealed resin layer which is caused by heat load.

In order to achieve the aforementioned object, there is provided a resin-sealed type semiconductor device which comprises a lead frame having a bed and external lead, a semiconductor element mounted on the bed and having electrodes, a fine metal wire for making an electrical connection between the lead and the electrode, a resin layer for sealing the semiconductor element, the fine metal wire and a portion of the lead frame therein, and a recess which is formed at a central portion of one surface side of the resin layer and has a controlled depth.

BRIEF DESCRIPTION OF THE DRAWINGS

FIG. 3 is a comparison graph showing a relation of a shear strength and saturation vapor pressure to the surface temperature of the present semiconductor device as compared with that of a conventional semiconductor device.

DETAILED DESCRIPTION OF THE PREFERRED EMBODIMENTS

Figure 1:
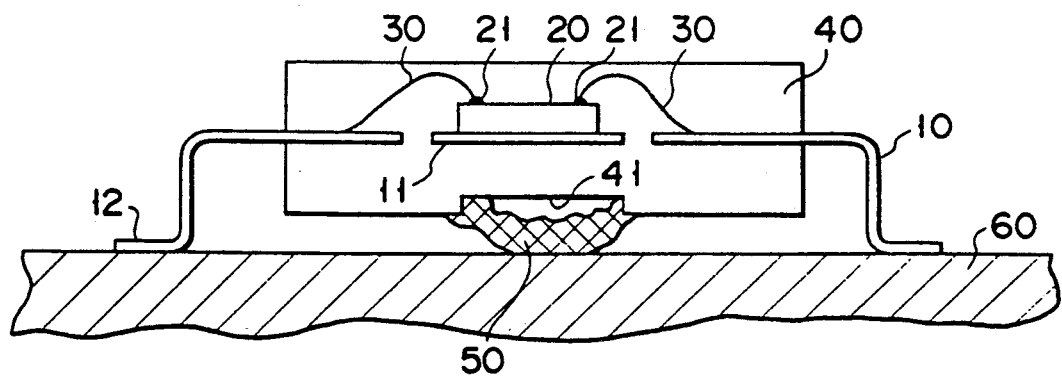
FIG. 1 is a cross-sectional view diagrammatically showing a resin-sealed type semiconductor device which is temporarily bonded by a bond layer to a mount substrate.
Figure 2A:
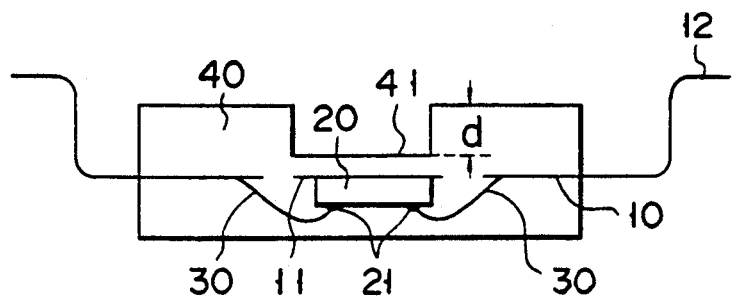
FIG. 2A is a cross-sectional view diagrammatically showing a resin-sealed type semiconductor device according to an embodiment of the present invention.
Figure 2B:
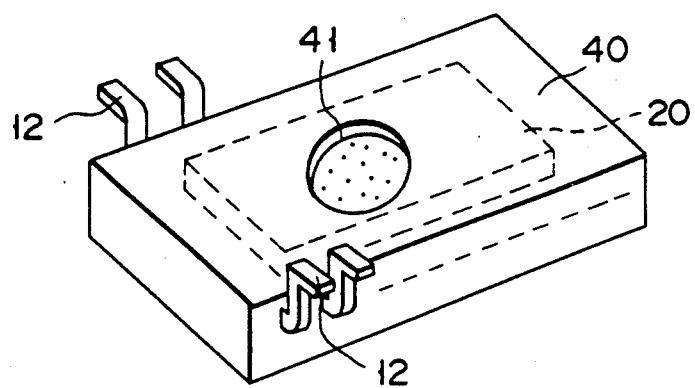
FIG. 2B is a perspective view diagrammatically showing the resin-sealed type semiconductor device of the present invention.

As shown in FIGS. 1 and 2, a resin-sealed type semiconductor device of the present invention includes a lead frame 10. The lead frame may be of a known STP, a DIP or a mixed type which is selected in accordance with the use to which the device is placed. For example, the lead frame for the DIP or the mixed type is composed of a greater number of metal frames in a continuous array and classified into a large length of lead frame and a small length of lead frame by the number of metal frames used. These lead frames are applied to a multi-pin semiconductor device of a greater integration density. The lead frame includes a frame having a metal bed 11 at its central portion and a plurality of ribbon-form external leads 12. The lead frame of the present invention can be applied to what is called a depression type structure with a bed displaced relative to the lead. The aforementioned semiconductor device includes a semiconductor element 20 mounted on the bed and having electrodes 21. The electrode of the semiconductor element is electrically connected by a fine metal wire 30 to the external lead of the lead frame. This way of connection is achieved by, for example, a thermals compression bonding method or an ultrasonic thermal bonding method. The semiconductor element 20, a portion of the lead frame 10' and fine metal wire 30 are fixedly sealed inside a resin layer 40, preventing the semiconductor element from being contaminated in an outer atmosphere. The step of sealing the resin layer is performed by means of a special device called a "multipot system" in which case a tablet-form resin is used. The resin which is melted in each pot is transferred past a cull into a mold at which time the semiconductor element, the portion of the lead frame and fine metal wire have already been arranged in the cavity of the mold. That is, these component parts are sealed with a resin which is introduced past the gate of the mold into the cavity of the mold. Then the resin undergoes an aging process. After these steps have been completed, a resin layer or mass containing such component parts is knocked out of the mold by an ejector pin which is located at the lower mold half. By this knock-out step, a recess 41 is formed at the central portion of one surface side of the resin layer opposite to a side on which the semiconductor element is located. The recess is controlled to a depth d, preferably to a depth of 60 pm or below. The recess is preferably so dimensioned that it is smaller than the dimension of metal bed 11 on which semiconductor element 20 is mounted. This is because it is possible to prevent the development of cracks.

As shown in FIG. 1, the semiconductor device thus arranged is temporarily fixed to a substrate 60 with a bond layer 50 interposed in the recess of the resin layer 40. Then each external lead is soldered to the substrate.

The resin layer 40 of the present invention has a recess 41 of a controlled depth as will be set forth below.

The inventors have found that water droplets which are deposited on a surface side opposite to that surface side of the bed of the lead frame where the semiconductor element is located are vaporized by heat load caused at the surface mount step and, at the same time, cause the development of cracks in the sealed resin layer. The inventors have also found that a bond material by which the sealed resin layer is bonded to the mount substrate is raised or expanded by a vapor pressure produced by the vaporization of the water droplets so that a bond effect is weakened. Further the inventors have researched on the relation of the shape and size of the sealed resin layer to the generation of cracks and to the bond effect and have found that the raising of a bond layer and development of cracks in the sealed resin layer can be suppressed by controlling the recess particularly to a depth of 60 pm or below. The inventors assume that this fact can be explained from the relation of the saturation vapor pressure of water to the shear strength of the sealed resin. In a graph shown in FIG. 3, the abscissa represents the surface temperature of the sealed resin layer and the ordinate represents the shear strength of the sealed resin layer and saturation vapor pressure produced by the vaporization of water droplets. In FIG. 3, the curve a represents a saturation vapor pressure prevalent at the surface temperature and the curve b represents a variation in shear strength of a resin layer prevalent at its surface temperature when it has a recess whose depth is 60 μm or below. It has been found that cracks occur at an NG area where the saturation vapor pressure of the sealed resin is great compared with the shear strength and that ho cracks occur at an OK area where the saturation vapor pressure of the sealed resin is small compared with the shear strength. In this connection it is to be noted that the soldering temperature was 240° C. to 260° C. From the graph it is found that the resin layer whose recess has a controlled depth can suppress the development of cracks in the sealed resin layer in view of the fact that, at a soldering temperature range as set forth above, the shear strength is great compared with the saturation vapor pressure. In contrast, the curve b' in FIG. 3 denotes a variation in shear strength of a conventional sealed resin layer at its surface temperature when it has a recess whose depth is 100 μm. From this it will be found that the conventional sealed resin layer cannot suppress the development of cracks when, at a soldering temperature of 260° C. suffered by the sealed resin layer, the saturation vapor pressure is great compared with the shear strength.

According to the present invention, it is possible to prevent a mount failure, upon the mounting of a resin-sealed type semiconductor element, which is caused by a heat source, such as a soldering spot and to prevent a lack of a functional recovery of the semiconductor substrate which is caused by a deteriorated moist-resistant characteristic. It is, therefore, possible to obtain an ultra-thin type surface-mount semiconductor device. That is, according to the present invention, a small, very-thin type semiconductor device can be obtained which is very high in integration density and high in value added.

EXAMPLE

A DIP or a DIP/SIP-mixed lead frame 10 is prepared. Then a semiconductor element 20, such as a BI-C/MOS or a D-RAM, which is higher in integration density is mounted on a respective bed 11 of a lead frame 10 of such a type as set forth above. This mounting is achieved by an ordinary method using an electroconductive bonding agent and gold/silicon eutectic alloy. Then a fine metal wire 30 which is connected at one end to each lead of the lead frame 10 and at the other end to an electrode 21 formed on the semiconductor element 20 is fixed in place by a thermocompression bonding method.

Then a mold is placed on an apparatus which performs a resin sealing step. An assembly of a lead frame, semiconductor element and fine metal line is located in the cavity of the mold and a resin-is filled into the mold cavity to form a sealed resin layer. This molding method is a known transfer molding method which utilizes, for example, a multi-pot system and tablet-form resin. The dimension of the resin layer, though depending upon the type of machines, is so designed that it is about 20 mm long, about 14 mm wide and about 1.4 mm thick. The resin layer material is epoxy resin.

The resin-sealed semiconductor element is knocked out of the mold by the ejector pin which is located at the lower mold half of the mold. By so doing, a recess 41 is formed at the resin layer not yet completely solidified. The recess has a controlled depth of preferably 60 μm or below. The controlled depth of the recess is achieved by adjusting the dimension of the ejector pin in accordance with the type of semiconductor device, that is, the depth of the sealed resin layer. The recess has a surface smaller than that of the metal bed on which the semiconductor element is mounted and the diameter of the recess, though depending upon the size of the semiconductor element, is, for example, about 2 mm to 3 mm. After the resin sealing step, the semiconductor element is mounted on a device which needs a surface mount. That is, after an external lead bonding step and so on, the semiconductor element is temporarily fixed to the mount substrate 60 by a bond layer 50 which is coated near the recess. Then the bent end portion of the external lead is soldered to the mount substrate. The soldering step is carried out by bringing the bent end portion of the external lead which is taken out of the sealed resin layer into contact with the mount substrate such as a printed board, while applying a solder to that place, and passing the solder layer through a heat source such as a reflow furnace whereby the external lead is fixed to the mount substrate. It has been observed that, in the resin-sealed type semiconductor device, no crack occurs in the resin layer thus obtained.

What is claimed is:

1. A method for manufacturing a resin-sealed type semiconductor device, comprising the steps of:
   preparing a lead frame having a bed and external leads,
   mounting a semiconductor element on the bed, said semiconductor element having at least one electrode;
   electrically connecting the lead frame to the electrode by a fine metal wire;
   fixedly sealing said semiconductor element, said fine metal wire and a portion of said lead frame with a resin layer formed in a mold; and
   forming a recess having a controlled depth of about 60 $\mu$m or less in the resin layer by knocking the resin layer out of the mold with an ejector pin, the controlled depth being sufficiently shallow to substantially prevent cracks from occurring in the bottom of the recess during a subsequent soldering process.

2. The method according to claim 1, wherein said recess is formed on a side opposite to that on which said semiconductor element is located, said recess being in an opposing relation to the semiconductor element and being smaller in dimension than the semiconductor element.

3. A method for manufacturing a resin-sealed type semiconductor device, comprising the steps of:
   preparing a lead frame having a bed and external leads;
   mounting a semiconductor element on the bed, the semiconductor element having at least one electrode;
   electrically connecting the lead frame to the electrode by a fine metal wire;
   fixedly sealing the semiconductor element, fine metal wire and a portion of the lead frame with a resin layer formed in a mold;
   forming a recess having a controlled depth of about 60 $\mu$m or less in the resin layer by knocking the resin layer out of the mold with an ejector pin;
   temporarily fixing the resin layer to a mount substrate by coating a bond material near the recess; and
   fixedly soldering the external lead to the substrate, the controlled depth of the recess being sufficiently shallow to substantially prevent cracks from occurring in the bottom of the recess during the soldering step.

4. The method according to claim 3, wherein said recess is formed on a side opposite to that on which said semiconductor element is located, said recess being an opposing relation to the semiconductor element and being smaller in dimension than the semiconductor element.

* * * * *